US012184499B2

(12) United States Patent
de Lescure (10) Patent No.: US 12,184,499 B2
(45) Date of Patent: Dec. 31, 2024

(54) SYSTEM AND METHOD FOR EDITING A NETWORK-ON-CHIP (NOC)

(71) Applicant: ARTERIS, INC., Campbell, CA (US)

(72) Inventor: Benoit de Lescure, Campbell, CA (US)

(73) Assignee: ARTERIS, INC., Campbell, CA (US)

( * ) Notice: Subject to any disclaimer, the term of this patent is extended or adjusted under 35 U.S.C. 154(b) by 290 days.

(21) Appl. No.: 17/942,180

(22) Filed: Sep. 12, 2022

(65) Prior Publication Data
US 2023/0099903 A1    Mar. 30, 2023

Related U.S. Application Data

(60) Provisional application No. 63/250,071, filed on Sep. 29, 2021.

(51) Int. Cl.
*H04L 41/12* (2022.01)
*H04L 41/06* (2022.01)
*H04L 41/22* (2022.01)
*H04L 49/109* (2022.01)

(52) U.S. Cl.
CPC ............ *H04L 41/12* (2013.01); *H04L 41/06* (2013.01); *H04L 41/22* (2013.01); *H04L 49/109* (2013.01)

(58) Field of Classification Search
None
See application file for complete search history.

(56) References Cited

U.S. PATENT DOCUMENTS

| | | |
|---|---|---|
| 5,485,396 A | 1/1996 | Brasen et al. |
| 5,541,849 A | 7/1996 | Rostoker et al. |
| 5,623,420 A | 4/1997 | Yee et al. |
| 5,638,288 A | 6/1997 | Deeley |
| 5,761,078 A | 6/1998 | Fuller et al. |
| 5,887,670 A | 3/1999 | Tabata et al. |
| 5,903,886 A | 5/1999 | Heimlich et al. |
| 5,983,277 A | 11/1999 | Heile et al. |
| 6,002,857 A | 12/1999 | Ramachandran |
| 6,134,705 A | 10/2000 | Pedersen et al. |
| 6,145,117 A | 11/2000 | Eng |

(Continued)

FOREIGN PATENT DOCUMENTS

| | | |
|---|---|---|
| CN | 105187313 B | 5/2018 |
| CN | 109587081 A | 4/2019 |

(Continued)

OTHER PUBLICATIONS

Chaari Moomen Moomen Chaari@Infineon Com et al: "A model-based and simulation-assisted FMEDA approach for safety-relevant E/E systems", Proceedings of the 34th ACM SIGMOD-SIGACT-SIGAI Symposium on Principles of Database Systems, ACMPUB27, New York, NY, USA, Jun. 7, 2015 (Jun. 7, 2015), pp. 1-6, XP058511366, DOI: 10.1145/2744769.2747908 ISBN: 978-1-4503-3550-8.

(Continued)

*Primary Examiner* — Quang N Nguyen
(74) *Attorney, Agent, or Firm* — Jubin Dana; Dana Legal Services (57) ABSTRACT

A system and method implemented by tool is disclosed. The tool receives input of a network-on-chip (NoC) and the NoC's desired connectivity and efficiently guides the designer through interactive NoC topology editing sessions to ensure the obtained network is both complete and correct during topology creation or modification.

12 Claims, 9 Drawing Sheets

(56) References Cited

U.S. PATENT DOCUMENTS

| | | |
|---|---|---|
| 6,249,902 B1 | 6/2001 | Igusa et al. |
| 6,321,363 B1 | 11/2001 | Huang et al. |
| 6,360,356 B1 | 3/2002 | Eng |
| 6,378,121 B2 | 4/2002 | Hiraga |
| 6,421,321 B1 | 7/2002 | Sakagawa et al. |
| 6,437,804 B1 | 8/2002 | Ibe et al. |
| 6,449,761 B1 | 9/2002 | Greidinger et al. |
| 6,622,225 B1 | 9/2003 | Kessler et al. |
| 6,883,455 B2 | 4/2005 | Maeda et al. |
| 6,907,591 B1 | 6/2005 | Teig et al. |
| 7,096,436 B2 | 8/2006 | Bednar et al. |
| 7,398,497 B2 | 7/2008 | Sato et al. |
| 7,587,687 B2 | 9/2009 | Watanabe et al. |
| 7,788,625 B1 | 8/2010 | Donlin et al. |
| 8,042,087 B2 | 10/2011 | Murali et al. |
| 8,302,041 B1 | 10/2012 | Chan et al. |
| 8,819,611 B2 | 8/2014 | Philip et al. |
| 9,184,998 B2 | 11/2015 | Xue |
| 9,262,359 B1 | 2/2016 | Noice et al. |
| 9,444,702 B1 | 9/2016 | Raponi et al. |
| 9,569,574 B1 | 2/2017 | Khan et al. |
| 9,792,397 B1 | 10/2017 | Nagaraja |
| 9,825,779 B2 | 11/2017 | Ruymbeke et al. |
| 9,940,423 B2 | 4/2018 | Lescure |
| 10,068,047 B1 | 9/2018 | Finn |
| 10,282,502 B1 | 5/2019 | BShara et al. |
| 10,348,563 B2 | 7/2019 | Rao et al. |
| 10,460,062 B2 | 10/2019 | Feld et al. |
| 10,733,350 B1 | 8/2020 | Prasad et al. |
| 10,853,545 B1 | 12/2020 | Nardi et al. |
| 10,922,471 B2 | 2/2021 | Baeckler et al. |
| 10,977,401 B1 * | 4/2021 | Arnold ................. G06F 30/343 |
| 10,990,724 B1 | 4/2021 | Cherif et al. |
| 11,121,933 B2 | 9/2021 | Cherif et al. |
| 11,281,827 B1 | 3/2022 | Labib et al. |
| 11,449,655 B2 | 9/2022 | Cherif et al. |
| 2003/0093765 A1 | 5/2003 | Lam et al. |
| 2004/0040007 A1 | 2/2004 | Harn |
| 2004/0230919 A1 | 11/2004 | Balasubramanian et al. |
| 2005/0073316 A1 | 4/2005 | Graham |
| 2005/0268258 A1 | 12/2005 | Decker |
| 2007/0156378 A1 | 7/2007 | McNamara |
| 2007/0157131 A1 | 7/2007 | Watanabe et al. |
| 2007/0174795 A1 | 7/2007 | Lavagno et al. |
| 2007/0186018 A1 | 8/2007 | Radulescu et al. |
| 2008/0046854 A1 | 2/2008 | Tang |
| 2008/0049753 A1 | 2/2008 | Heinze et al. |
| 2008/0279183 A1 | 11/2008 | Wiley et al. |
| 2008/0291826 A1 | 11/2008 | Licardie et al. |
| 2009/0031277 A1 | 1/2009 | Mcelvain et al. |
| 2009/0313592 A1 | 12/2009 | Murali et al. |
| 2010/0061352 A1 | 3/2010 | Fasolo et al. |
| 2010/0162189 A1 | 6/2010 | Lavagno et al. |
| 2010/0218146 A1 | 8/2010 | Platzker et al. |
| 2010/0274785 A1 | 10/2010 | Procopiuc et al. |
| 2011/0170406 A1 | 7/2011 | Krishnaswamy |
| 2012/0013509 A1 | 1/2012 | Wisherd et al. |
| 2012/0311512 A1 | 12/2012 | Michel et al. |
| 2013/0174113 A1 | 7/2013 | Lecler et al. |
| 2013/0208598 A1 | 8/2013 | Nakaya et al. |
| 2013/0258847 A1 | 10/2013 | Zhang et al. |
| 2013/0283226 A1 | 10/2013 | Ho et al. |
| 2014/0115218 A1 | 4/2014 | Philip et al. |
| 2014/0126572 A1 | 5/2014 | Hutton et al. |
| 2014/0153575 A1 | 6/2014 | Munoz |
| 2014/0156826 A1 | 6/2014 | Chang et al. |
| 2014/0160939 A1 | 6/2014 | Arad et al. |
| 2014/0169173 A1 | 6/2014 | Naouri et al. |
| 2014/0204735 A1 | 7/2014 | Kumar et al. |
| 2014/0211622 A1 | 7/2014 | Kumar et al. |
| 2014/0298281 A1 | 10/2014 | Varadarajan et al. |
| 2014/0321839 A1 | 10/2014 | Armstrong |
| 2015/0036536 A1 | 2/2015 | Kumar et al. |
| 2015/0106778 A1 | 4/2015 | Mangano et al. |
| 2015/0121319 A1 | 4/2015 | Hutton et al. |
| 2015/0178435 A1 | 6/2015 | Kumar |
| 2015/0254325 A1 | 9/2015 | Stringham |
| 2015/0341224 A1 | 11/2015 | Van et al. |
| 2015/0347641 A1 | 12/2015 | Gristede et al. |
| 2016/0103943 A1 | 4/2016 | Xia et al. |
| 2016/0275213 A1 | 9/2016 | Tomita |
| 2016/0321390 A1 | 11/2016 | Bozman et al. |
| 2017/0060204 A1 | 3/2017 | Gangwar et al. |
| 2017/0063734 A1 | 3/2017 | Kumar |
| 2017/0132350 A1 | 5/2017 | Janac |
| 2017/0177778 A1 * | 6/2017 | de LESCURE ...... G06F 30/392 |
| 2017/0193136 A1 | 7/2017 | Prasad et al. |
| 2018/0115487 A1 | 4/2018 | Thubert et al. |
| 2018/0144071 A1 | 5/2018 | Yu et al. |
| 2018/0227180 A1 | 8/2018 | Rao et al. |
| 2019/0012909 A1 | 1/2019 | Mintz |
| 2019/0073440 A1 | 3/2019 | Farbiz et al. |
| 2019/0205493 A1 | 7/2019 | Garibay et al. |
| 2019/0246989 A1 | 8/2019 | Genov et al. |
| 2019/0251227 A1 | 8/2019 | Fink |
| 2019/0260504 A1 | 8/2019 | Philip et al. |
| 2019/0266089 A1 * | 8/2019 | Kumar ................ G06F 12/0813 |
| 2019/0363789 A1 | 11/2019 | Lee et al. |
| 2020/0092230 A1 | 3/2020 | Schultz et al. |
| 2020/0162335 A1 | 5/2020 | Chen et al. |
| 2020/0234582 A1 | 7/2020 | Mintz |
| 2020/0366607 A1 | 11/2020 | Kommula et al. |
| 2021/0058289 A1 * | 2/2021 | Gangwar .............. H04L 49/109 |
| 2021/0203557 A1 | 7/2021 | Cherif et al. |
| 2021/0226887 A1 | 7/2021 | Mereddy |
| 2021/0320869 A1 | 10/2021 | Bourai et al. |
| 2021/0409284 A1 | 12/2021 | Cherif et al. |
| 2022/0294704 A1 | 9/2022 | Lescure et al. |

FOREIGN PATENT DOCUMENTS

| | | |
|---|---|---|
| CN | 113051215 A | 6/2021 |
| CN | 113055219 A | 6/2021 |
| DE | 102015014851 A1 | 5/2016 |
| EP | 3842987 A1 | 6/2021 |
| EP | 4024262 A1 | 7/2022 |
| EP | 4057179 A1 | 9/2022 |

OTHER PUBLICATIONS

Mariani R et al: "Fault-Robust Microcontrollers for Automotive Applications", On-Line Testing Symposium, 2006. IOLTS 2006. 12th IEEE International Como, Italy Jul. 10-12, 2006, Piscataway, NJ, USA, IEEE, Jul. 10, 2006 (Jul. 10, 2006), pp. 213-218, XP010928275, DOI: 10.1109/IOLTS.2006.38 ISBN: 978-0-7695-2620-1.

U.S. Appl. No. 17/134,384, filed Dec. 26, 2020, Federico Angiolini.

U.S. Appl. No. 17/665,578, filed Feb. 6, 2022, K. Charles Janac.

"A distributed interleaving scheme for efficient access to wideIO dram memory", Seiculescu Ciprian, Benini Luca, De Micheli Giovanni, CODES+ISSS'12 (Year: 2012).

"Thread-Fair Memory Request Reordering"; Kun Fang, Nick Iliev, Ehsan Noohi, Suyu Zhang, and Zhichun Zhu; Dept. of ECE, Univeristy of Illinois at Chicago; JWAC-3 Jun. 9, 2012.

19th Asia and South Pacific Design Automation Conterence Alberto Ghiribaldi, Herve Tatenguem Fankem, Federico Angiolini, Mikkel Stensgaard, Tobias Bjerregaard, Davide Bertozzi a Vertically Integrated and Interoperable Multi-Vendor Synthesis Flow for Predictable NoC Design in Nanoscale Technologies.

ACM ICCAD '06 Srinivasan Murali, Paolo Meloni, Federico Angiolini, David Atienza, Salvatore Carta, Luca Benini, Giovanni De Micheli, Luigi Raffo Designing Application-Specific Networks on Chips with Floorplan Information p. 8, Figure 8.

Alessandro Pinto et al, "System level design paradigms", ACM Transactions on Design Automation of Electronic Systems, ACM, New York, NY, US, (Jun. 7, 2004), vol. 11, No. 3, doi:10.1145/1142980.1142982, ISSN 1084-4309, pp. 537-563, XP058222500.

Annual IEEE International SoC Conference Proceedings Mohammad reza Kakoee, Federico Angiolin, Srinivasan Murali, Antonio (56) References Cited

OTHER PUBLICATIONS

Pullini, Ciprian Seiculescu, and Luca Benini A Floorplan-aware Interactive Tool Flow for NoC Design and Synthesis pp. 1, 2, 4 2009 Belfast, Northern Ireland, UK.

Bo Huang et al, "Application-Specific Network-on-Chip synthesis with topology-aware floorplanning", Integrated Circuits and Systems Design (SBCCI), 2012 25th Symposium ON, IEEE, (Aug. 30, 2012), doi:10.1109/SBCCI.2012.6344421, ISBN 978-1-4673-2606-3, pp. 1-6, XP032471227.

David Atienza et al, Network-on-Chip Design and Synthesis Outlook, Science Direct, Integration the VLSI, journal 41 (2008) 340-359.

Dumitriu Vet Al: "Throughput-Oriented Noc Topology Generation and Analysis for High Performance SoCs", IEEE Transactions on Very Large Scale Integration (VLSI) Systems, IEEE Service Center, Piscataway, NJ, USA, vol. 17, No. 10, Oct. 1, 2009 (Oct. 1, 2009), pp. 1433-1446, XP011267808, ISSN: 1063-8210, DOI: 10.1109/TVLSI.2008.2004592.

Fangfa Fu et al: "A Noc performance evaluation platform supporting designs at multiple levels of abstraction", Industrial Electronics and Applications, 2009. ICIEA 2009. 4th IEEE Conference ON, IEEE, Piscataway, NJ, USA, May 25, 2009 (May 25, 2009), pp. 425-429, XP031482069, ISBN: 978-1-4244-2799-4 *abstract* * p. 426-p. 429 *.

Francesco Robino: "A model-based design approach for heterogeneous NoC-based MPSoCs on FPGA", Jul. 1, 2014 (Jul. 1, 2014), XP002806918, Retrieved from the Internet: URL: http://www.divaportal.org/smash/get/diva2:718518/FULLTEXT02.pdf [retrieved on Jun. 22, 2022].

Jean-Jacques Lecler et al: Application driven network-on-chip architecture exploration & refinement for a complex SoC, Design Automation for Embedded Systems, vol. 15 No. 2, Apr. 7, 2011, DOI: 10.1007/S10617-011-9075-5.

K. R. Manik et al., "Methodology for Design of Optimum NOC Based on I PG," 2017 Int'l Conference on Algorithms, Methodology, Model and Applications in Emerging Technologies (ICAMMAET), Chennai, India, IEEE, 6 pages. (Year: 2017).

Luca Benini: "Application specific Noc design", Design, Automation and Test in Europe, 2006, Date '06 : Mar. 6-10, 2006, [Munich, Germany; Proceedings] / [Sponsored by the European Design and Automation Association], IEEE, Piscataway, NJ, USA, Mar. 6, 2006 (Mar. 6, 2006), pp. 491-495, XP058393584, ISBN: 9783981080100.

Murali et al: "Synthesis of Predictable Networks-on-Chip-Based Interconnect Architectures for Chip Multiprocessors", IEEE Transactions on Very Large Scale Integration (VLSI) Systems, IEEE Service Center, Piscataway, NJ, USA, vol. 15, No. 8, Aug. 1, 2007 (Aug. 1, 2007), pp. 869-880, XP011187732, ISSN: 1063-8210, DOI: 10.1109/TVLSI.2007.900742.

Partha et al., Design, Synthesis, and Test of Networks on Chips, IEEE (Year: 2005).

Picornell Tomas Tompic@GAP.UPV.ES et al: "DCFNoC A Delayed Conflict-Free Time Division Multiplexing Network on Chip", Designing Interactive Systems Conference, ACM, 2 Penn Plaza, Suite 701 New York NY10121-0701 USA, Jun. 2, 2019 (Jun. 2, 2019), pp. 1-6, XP058637807, DOI: 10.1145/3316781.3317794 ISBN: 978-1-4503-5850-7.

Srinivasan K et al, "Linear programming based techniques for synthesis of network-on-chip architectures", Computer Design: VLSI in Computers and Processors, 2004. ICCD 2004. Pr oceedings. IEEE International Conference ON San Jose, CA, USA Oct. 11-13, 2004, Piscataway, NJ, USA, IEEE, (Oct. 11, 2004), doi:10.1109/ICCD.2004.1347957, ISBN 978-0-7695-2231-9, pp. 422-429, XP010736641.

Srinivasan Murali et al: "Mapping and physical planning of networks-on-chip architectures with quality-of-service guarantees", Proceedings of the 2005 Asia and South Pacific Design Automation Conference, Jan. 18, 2005, DOI: 10.1145/1120725.1120737.

Tobias Bjerregaard et al: " A Router Architecture for Connection-Oriented Service Guarantees in the MANGO Clockless Network-on-Chip", Proceedings of the IEEE Conference and Exhibition on Design, Automation, and Test in Europe, Mar. 7, 2005, DOI: 10.1109/DATE.2005.36.

Wei Zhong et al: "Floorplanning and Topology Synthesis for Application-Specific Network-on-Chips", IEICE Transactions on Fundamentals of Electronics< Communications and Computer Sciences, Jun. 1, 2013, DOI: 10.1587/TRANSFUN.E96.A.1174.

Zhou Rongrong et al: A Network Components Insertion Method for 3D Application-Specific Network-on-Chip, Proceedings of the 11th IEEE International Conference on Asic, Nov. 3, 2015, pp. 1-4, DOI: 10.1109/ASICON.2015.7516952.

Anonymous: "Intel Hyperflex Architecture HighPerformance Design Handbook", Oct. 4, 2021 (Oct. 4, 2021), pp. 1-147, XP093063924, Retrieved from the Internet: URL:https://cdrdv2.intel.com/vl/dl/getContent/667078?fileName=sI0_hp_hb-683353-667078.pdf.

James C. Tiernan. 1970. An efficient search algorithm to find the elementary circuits of a graph. Commun. ACM 13, 12 (Dec. 1970), 722-726. https://doi.org/10.1145/362814.362819.

Ken Eguro et al: "Simultaneous Retiming and Placement for Pipelined Net lists", Proceedings of the 16th International Symposium on Field-Programmable Custom Computing Machines, Apr. 14, 2008 (Apr. 14, 2008), pp. 139-148, XP031379339.

Anonymous: "Network on a chip—Wikipedia", Jun. 15, 2021, https://en.wikipedia. org/w/index.php?title-Network_on_a_chip&oldid-1028654828.

Haytham Elmiligi et al: "Networks-on-chip topology optimization subject to power, delay, and reliability constraints", IEEE International Symposium on Circuits and Systems, May 30, 2010, pp. 2354-2357 DOI: 10.1109/ISCAS 2010.5537194.

Jain R. et al: "Predicting system-level area and delay for pipelined and nonpipelined designs", IEEE Transactions on Computer Aided Design of Integrated Circuits and Systems, vol. 11, No. 8, Jan. 1, 1992, pp. 955-965, DOI: 10. 1109/43.149767.

Jingye Xu et al: "Latch Based Interconnect Pipelining for High Speed Integrated Circuits", Proceedings of the International Conference on Electro/Information Technology, May 1, 2006, pp. 295-300 DOI: 10.1109/EIT 2006.252152.

Jun Minje et al: "Exploiting Implementation Diversity and Partial Connection of Routers in Application-Specific Network-on-Chip Topology Synthesis", IEEE Transactions on Computers, IEEE, USA, vol. 63, No. 6, Jun. 1, 2014 (Jun. 1, 2014), pp. 1434-1445, XP011550397, ISSN: 0018-9340, DOI: 10. 1109/TC.2012.294.

Saponara S et al: "Design and coverage-driven verification of a novel network-interface IP macrocell for network-on-chip interconnects", Microprocessors and Microsystems, vol. 35, No. 6 , pp. 579-592, XP028255708 ISSN: 0141-9331, DOI: 10.1016/J.MICPRO, 2011.06.005.

Saponara Sergio et al: "Configurable network-on-chip router macrocells", Microprocessors and Microsystems, IPC Business Press Ltd. London, GB, vol. 45, Apr. 29, 2016 (Apr. 29, 2016), pp. 141-150, XP029678799, ISSN: 0141-9331, DOI: 10.1016/J.MICPRO. 2016.04.008.

Song Z et al: "A NoC-Based High Performance Deadlock Avoidance Routing Algorithm", Computer and Computational Sciences, 2008. IMSCCS '08, International Multisymposiums ON, IEEE Piscataway, NJ, USA, Oct. 18, 2008, pp. 140-143, XP031411025, ISBN: 978-0-7695-3430-5.

* cited by examiner

SYSTEM AND METHOD FOR EDITING A NETWORK-ON-CHIP (NOC)

CROSS REFERENCE TO RELATED APPLICATION

This application claims priority to U.S. Provisional Application Ser. No. 63/250,071 filed on Sep. 29, 2021 and titled SYSTEM AND METHOD FOR EDITING A NETWORKS-ON-CHIP (NoC) by Benoit DE LESCURE, the entire disclosure of which is incorporated herein by reference.

FIELD OF THE INVENTION

The present technology is in the field of computer system design and, more specifically, tool that allows editing of networks-on-chip.

BACKGROUND

Multiprocessor systems have been implemented in systems-on-chips (SoCs) that communicate through network-on-chips (NoCs). The SoCs include instances of sources (initiators) intellectual properties (IPs) and destination (targets) IPs. Transactions are sent from a source to one or more destinations using industry-standard protocols. Source, connected to the NoC, sends a request transaction to a destination, using an address to select the destination. The NoC decodes the address and transports the request from source to the destination. The destination handles the transaction and sends a response transaction, which is transported back by the NoC to source.

Typically, a NoC description is generated using a synthesis tool during the design process. The tool generates a NoC from a set of constraints. If changes are made, then the tool will have to be restarted and re-executed. One example of a traditional approach is selecting a new NoC element and adding it to the set of existing NoC elements. The user would then make and/or re-route connections between existing NoC elements. The user would then define specific routes through the new NoC element if there is ambiguity about the paths to take from a source to a destination.

Every time there is a change to the NoC topology or the input constraints change, the tool is restarted or the synthesis is re-executed. As such, there is a risk of giving a completely different solution from one run to the next, even if the changes are limited or minor. This is due to the nature of the network synthesis process, which typically uses a constraint solver approach to minimizing metrics, and the constraint solver may find very different solutions in response to minor changes or slightly different set of constraints. As such, the tool may find a different solution every time it runs for minor changes or slightly different constraints. Thus, the tool has a reduced usability when used by a SoC designer to automatically create the NoC. During the design time of SoC, the constraints change and evolve. If the tool generates substantially different results each time the tool runs and every time the user makes a small change, then this will lead to the designer being unable to reuse some of the implementation work already done. Therefore, what is needed is a solution that will take as input the NoC desired connectivity and efficiently guide the designer through interactive topology editing sessions at each step of topology creation or modification, to ensure the obtained network is both complete and correct.

SUMMARY

A solution is provided that will guide a designer through interactive topology editing sessions. The invention applies to tool that permits creating and modifying networks-on-chip (NoC or NoCs) topology. NoC topology includes a set of components that exist in the NoC, with the components' configuration, on one hand, and, on the other hand, a set of paths through these components describing the precise route between a source of traffic and a destination of traffic that needs to be logically connected.

For example, consider the situation when the NoC has already been generated from a set of constraints. The NoC components use an internal NoC transport protocol to communicate with each other, typically based on the transmission of packets. NIUs convert the protocol used by the attached system-on-chip (SoC) into the transport protocol used inside the NoC. Switches route flows of traffic between sources and destinations. Adapters deal with various conversions between data width, clock and power domains. Buffers are used to insert pipelining elements to span long distances, or to store packets to deal with rate adaptation between fast senders and slow receivers or vice-versa. NoCs are implemented in SoCs with digital logic, such as logic gates and sequential elements (flip-flops) The result has been processed through the ASIC design flow with logic synthesis and place and route steps done. The steps typically take a lot of time, e.g. multiple days. After this first generation, it is decided to remove a component from the SoC, which result in slight modification of the floorplan and the connectivity. The tool generating the NoC is run again with the updated constraints. The tool gives a completely different result compared to the first run. As such, all the previous work on logic synthesis and place and route needs to be done again from scratch, even if the constraint change was very small. This is very costly for the project.

When creating or modifying the topology of a NoC by hand, either through a Graphical User Interface (GUI), or programmatically through a set of commands given to a tool, the NoC designer tries to ensure that the design choices (actions) result in a NoC that implements the desired functionality within the constraints. One of the key functionalities of a NoC is connectivity: the specification that a particular source of traffic, which includes transactions, is able to send packets to a particular destination. For large networks with many components, it can be difficult for the designer to ensure that the network is correct and implements effectively all the required paths between all sources of traffic and all the destinations.

In addition to implementing the desired connectivity where no paths are missing when they are required, the NoC topology shall also follow some rules, including constraints, regarding connection of the NoC elements with each other. These rules depend on the NoC technology used. One example is that no more than a single transport interface shall be used in components such as network interface units (NIUs) or adapters. Another example or that switches shall never exceed some specific size of ingress or egress ports numbers, etc.

BRIEF DESCRIPTION OF THE DRAWINGS

In order to more fully understand the invention, reference is made to the accompanying drawings or figures. The invention is described in accordance with the aspects and embodiments in the following description with reference to the drawings or figures (FIG.), in which like numbers represent the same or similar elements. Understanding that these drawings are not to be considered limitations in the scope of the invention, the presently described aspects and embodiments and the presently understood best mode of the invention are described with additional detail through use of the accompanying drawings.

DETAILED DESCRIPTION

The following describes various examples of the present technology that illustrate various aspects and embodiments of the invention. Generally, examples can use the described aspects in any combination. All statements herein reciting principles, aspects, and embodiments as well as specific examples thereof, are intended to encompass both structural and functional equivalents thereof. Additionally, it is intended that such equivalents include both currently known equivalents and equivalents developed in the future, i.e., any elements developed that perform the same function, regardless of structure.

It is noted that, as used herein, the singular forms "a," "an" and "the" include plural referents unless the context clearly dictates otherwise. Reference throughout this specification to "one aspect," "an aspect," "certain aspects," "various aspects," or similar language means that a particular aspect, feature, structure, or characteristic described in connection with any embodiment is included in at least one embodiment of the invention.

Appearances of the phrases "in one embodiment," "in at least one embodiment," "in an embodiment," "in certain embodiments," and similar language throughout this specification may, but do not necessarily, all refer to the same embodiment or similar embodiments. Furthermore, aspects and embodiments of the invention described herein are merely exemplary, and should not be construed as limiting of the scope or spirit of the invention as appreciated by those of ordinary skill in the art. The disclosed invention is effectively made or used in any embodiment that includes any novel aspect described herein. All statements herein reciting aspects and embodiments of the invention are intended to encompass both structural and functional equivalents thereof. It is intended that such equivalents include both currently known equivalents and equivalents developed in the future.

The terms "path" and "route" are used interchangeable herein. Paths or routes includes and are made up of any combination of nodes (nodes are also referred to herein as switches) and edges (edges are also referred to herein as links), along which data travels form source to destination (sink or target). According to various aspects and embodiments of the invention, a path or a route is an ordered list of NoC components along a given direction from a source to a destination. As used herein, a "master," "origin," "initiator," and "source node" refer to intellectual property (IP) blocks, units, or modules that initiate or send a transaction. The terms "master" and "initiator" and "source node" are used interchangeably within the scope and embodiments of the invention. As used herein, a "slave," a "target," "destination," and "sink node" refer to IP blocks that receive and handle transaction and, in some instances, produce or generate a response. The terms "slave" and "target" and "destination" and "sink node" are used interchangeably within the scope and embodiments of the invention. As used herein, a transaction may be a request transaction or a response transaction. Examples of request transactions include write request and read request.

As used herein, a node is defined as a distribution point or a communication endpoint that is capable of creating, receiving, and/or transmitting information over a communication path or channel. A node may refer to any one of the following: switches, splitters, mergers, buffers, and adapters. As used herein, splitters and mergers are switches; not all switches are splitters or mergers. As used herein and in accordance with the various aspects and embodiments of the invention, the term "splitter" describes a switch that has a single ingress port and multiple egress ports. As used herein and in accordance with the various aspects and embodiments of the invention, the term "merger" describes a switch that has a single egress port and multiple ingress ports.

Figure 1:
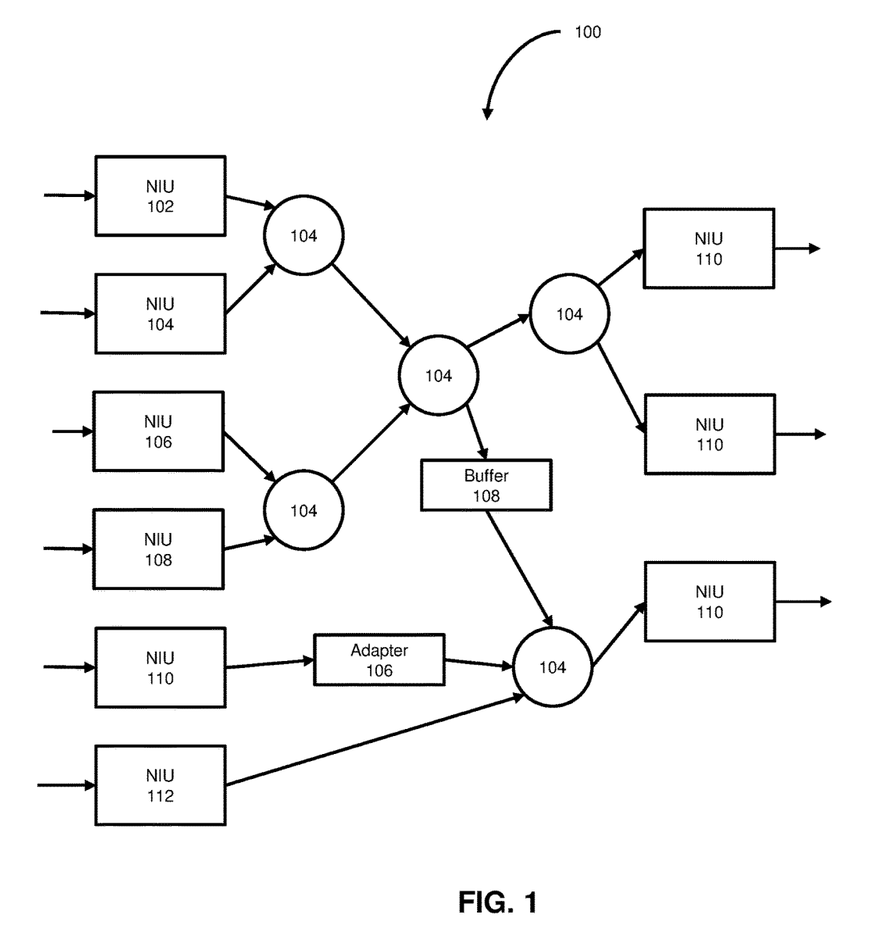
FIG. 1 Illustrates a logical view of a NoC with various elements to create a netlist in accordance with the various aspects and embodiments of the invention.

Referring now to FIG. 1, a network-on-chip (NoC) 100 is shown according to various aspects and embodiments of the invention. The NoC 100 includes elementary network components (elements), such as source network interface units (SNIUs) 102, switches 104, adapter 106 (only one is shown for clarity), buffer 108 (only one is shown for clarity), and destination network interface units (DNIUs) 110. The NoC 100 components use an internal NoC transport protocol to communicate with each other for transmission of packets. SNIU 102 are converting the protocol that is used by the attached IP blocks of the system-on-chip (SoC) into the transport protocol used inside the NoC 100.

Switches 104 route flows of traffic between source and destinations. Adapters 106 manage various conversions between data width, clock and power domains. Buffers 108 insert pipelining elements to span long distances, or to store packets to deal with rate adaptation between fast senders and slow receivers or slow senders and fast receivers. DNIUs 110 convert transport protocol used in the NoC 100 back into protocol used by the SoC. NoC 100 is implemented with digital logic, such as logic gates and sequential elements (flip-flops).

Figure 2:
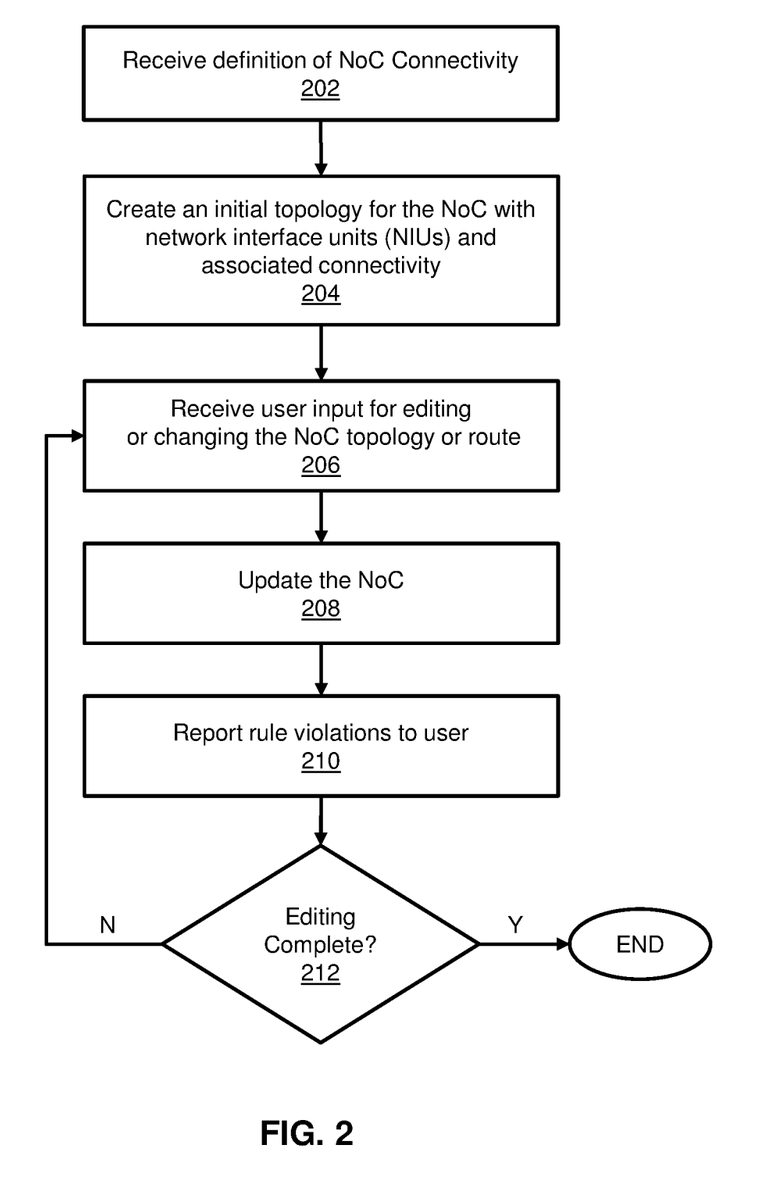
FIG. 2 illustrates a process for guiding a designer through interactive topology editing sessions in accordance with the various aspects and embodiments of the invention.

Referring now to FIG. 2 and FIG. 1, a flow process is shown for how a user interacts with tool to create the NoC 100 topology according to various aspects and embodiments of the invention. Steps 202, 206, and 212 represent user inputs. Steps 204, 208, and 210 represent actions performed by the tool, which allows a user to interact with the tool to create, configure and modify NoC topology.

At step 202 the process 200 starts by the user's definition of the required connectivity of the NoC 100. The user describes all sources and all destinations of traffic that are in communication with the NoC 100. The user also describes what traffic source shall reach which traffic destination. This description is done using the NoC 100 configuration tool and exists in a non-transitory computer readable form, either in memory or on a computer file.

In step 204, the tool creates an initial topology based on the user's inputs in accordance with some aspects and embodiments of the invention. At step 204, the tool automatically creates an initial topology based on the user's inputs in accordance with some aspects and embodiments of the invention. The initial topology includes, and is not limited by, the number of the network interface units 102 that are required to support sources and destinations of traffic. Typically, this first network is complete with all source to destination paths existing, even though some of which may be illegal. For example, it is illegal for multiple connections go out of or into network interface units (NIU), 102 which can only support one connection in accordance with some aspects and embodiments of the invention.

At step 206, the user selects and edits a set of routes in the NoC 100, by specifying NIU 102 sources of traffic and the NIU 110 destinations for the traffic. The user then selects which route changes through the NoC 100 need to be done. The user can select one or more routes to be changed. If the set or routes has more than one route, all selected routes shall have one or more elements in common. The user then selects an element that all of the routes have in common and chooses the selected element to be the insertion point.

When the user performs an editing operation, the user can either: (1) insert a new NoC 100 element on each selected route after the insertion point; (2) insert a new NoC 100 element on each selected route before the insertion point; (3) delete the insertion point from every route; or (4) replace the insertion point by another existing element. This is not a complete list of the operations that the user can execute on the routes in the NoC 100; other operations are possible.

At step 208, the tool automatically updates the NoC 100 netlist based upon the user's edits in accordance with some aspects and embodiments of the invention.

At step 210, the tool automatically finds and reports on rule violations in the netlist, which are based on the constraints and requirements. In accordance with some aspects and embodiments of the invention, a rule violation exists, and is considered illegal, when more than one connection goes into or out of network interface units that can only support one connection. If an illegal NoC 100 route is created, the tool alerts the user that a rule violation exists in one or more routes. In accordance with some aspects and embodiments of the invention, corrections are made based on the alerts. At step 212 the tool determines if the user is done with editing and determines if NoC route editing is complete or not complete. The user corrects the error(s) by completing actions listed in the third step 206. If at step 212 editing is not complete, for example because of errors or rule violations, then the process returns to step 210. At step 212, if no violations of a rule are found, the tool indicates to the user that editing of the NoC 100 routes is complete 212 and the process ends or is done.

Figure 3:
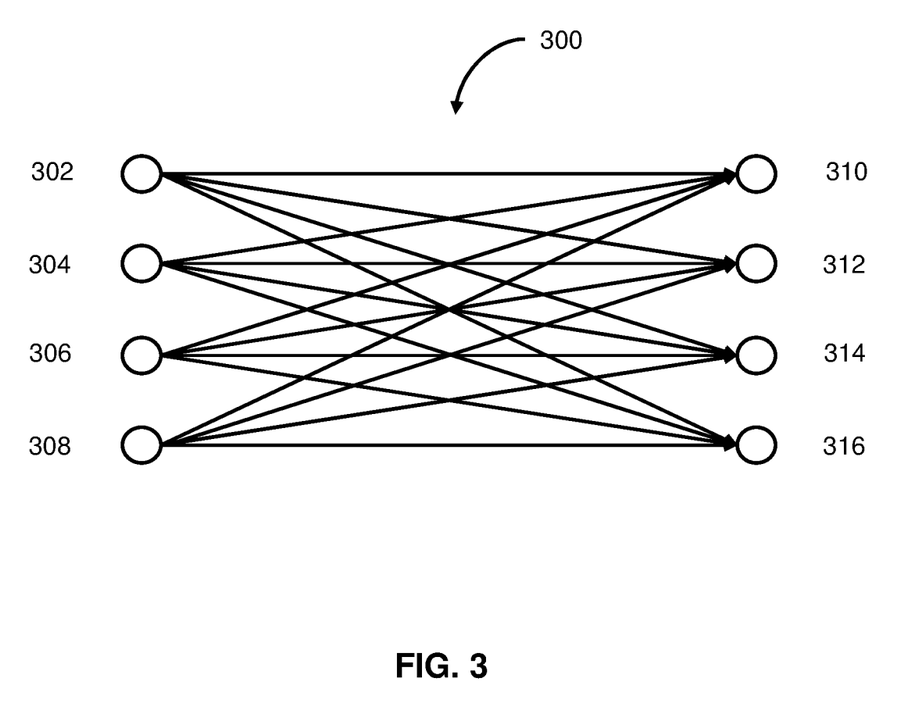
FIG. 3 illustrates high level connectivity map or chart for a NoC topology in accordance with the various aspects and embodiments of the invention.

Referring now to FIG. 3 and FIG. 2, according to various aspects and embodiments of the invention, a connectivity map or connectivity chart 300 is shown. The connectivity chart 300 represents the initial NoC topology based upon the users definition of connectivity from step 202 and the tool's creation of initial topology 204. The result creates four sources of traffic 302, 304, 306, and 308 of the chart 300 and four destinations for traffic 310, 312, 314, and 316 represented on the right margin of the chart 300. In accordance with some aspects and embodiments of the invention, a route exists between all four sources 302, 304, 306, 308 extending to all four destinations 310, 312, 314, 316. This is an initial creation of topology. This topology may have some portions that are illegal because multiple connections go out of each source of traffic 302, 304, 306, 308 and into each destination of traffic 310, 312, 314, 316. The connectivity that this NoC can be shown or illustrated as a matrix. The matrix would show all sources being able to send traffic to all destinations. In accordance with some aspects and embodiments of the invention, the chart 300 represents an illegal starting point for the NoC 100 topology; the tool edits and creates the desired NoC 100 traffic routing outcome as the user provides additional inputs and changes.

Figure 4:
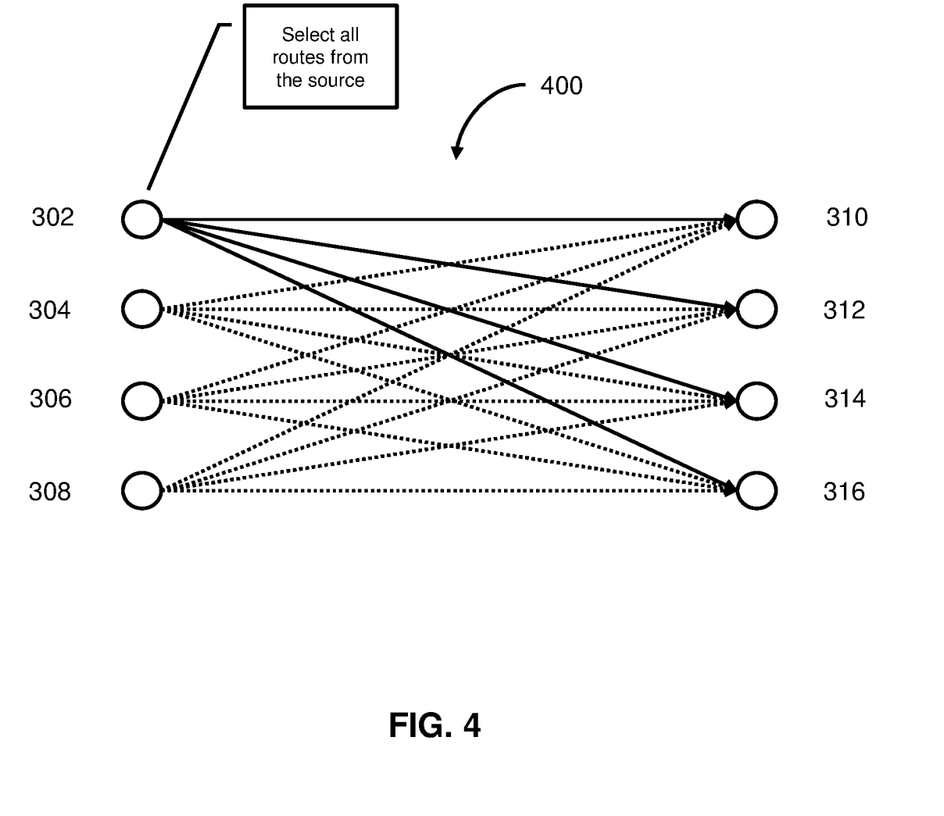
FIG. 4 illustrates the NoC of FIG. 3 highlighting routes from one source to four destinations in accordance with the various aspects and embodiments of the invention.

Referring now to FIG. 4, FIG. 3, and FIG. 2, according to various aspects and embodiments of the invention, a chart 400 is shown to indicate the result of an initial application of the tool to the illegal route configuration indicated in the chart 300. According to various aspects and embodiments of the invention, there are illegal routes in FIG. 3 because there is more than one output for the sources, such as source 302. In this example, the user has implemented user editing of illegal route configuration in the chart 300 with the tool editing from step 206. Next, the tool automatically updates (at step 208) the NoC netlist as indicated in chart 400. After an initial edit (at step 206) of the routes, four routes are created extending from 302, one to each of the four destinations 310, 312, 314, 316. In accordance with some aspects and embodiments of the invention, a matrix for the chart 400 can indicate the selection of all routes from route source 302. The tool evaluates this NoC configuration (at step 210) and determine if this route configuration is still illegal; for example and in accordance with some aspects and embodiments of the invention, it is illegal because multiple routes originate from a single source of traffic 302. The tool reports the rules violation to the user in accordance with some aspects and embodiments of the invention. The user can again edit the operation of the routes (at step 206).

In accordance with some aspects and embodiments of the invention, as the user modifies the routes in the NoC, and the tool infers the netlist of the NoC. Routes are ordered lists of NoC units that exist along a communication path between a source of traffic and a destination of traffic. The NoC netlist is the set of connections (wires) that exists between the NoC elements. The user selects a set of routes to modify first, then performs an editing operation.

After the user operation, the tool infers automatically the new elements required and the connections between the NoC elements (the netlist). If some NoC elements assembly rules are violated, the tool flags them to the user and the user can fix the errors. During step-by-step changes to the topology, there can be (and the topology may be) in an illegal state after a given step or change. The user is provided the error or illegal state information. The user is then able to fix the error during subsequent steps, for example by making additional changes. If the editing session is complete, the process exits, else the user proceeds with the next editing operation. In one embodiment, the user shall be able to save an editing session on a computer file, and resume it later.

Figure 5:
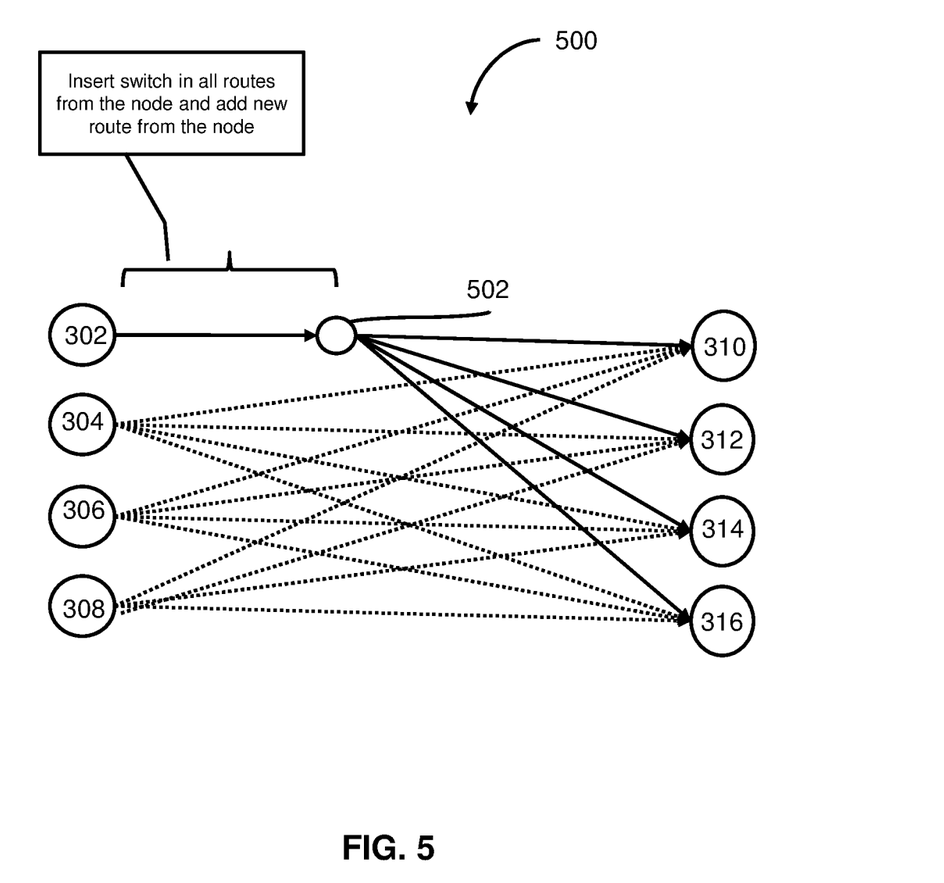
FIG. 5 illustrates modification of FIG. 4 in accordance with the various aspects and embodiments of the invention.

Referring now to FIG. 5, FIG. 4, and FIG. 2, according to various aspects and embodiments of the invention, a connectivity chart 500 representing a new NoC topology, which is created after the editing procedure performed on the NoC represented in chart 400, is shown. In accordance with some aspects and embodiments of the invention, the user performs an editing operation, which can be: inserting a new NoC element on each selected route after the insertion point; inserting a new NoC element on each selected route before the insertion point; deleting the insertion point from every route; and/or replacing the insertion point by another existing element. This list is not complete and other operations are possible. The various changes to the NoC topology, such as insertion, replacement, and deletion operations are within the scope of the invention. After the operation on routes is done, the tool automatically infers the update to the NoC topology and generates the netlist that is needed, which includes any one or more of:

(1) a new component is added to the topology;
(2) a deleted component is removed from the topology; and
(3) no longer used components are removed from the topology.

Connections between NoC components are updated to ensure the newly defined routes are implemented. In accordance with some aspects and embodiments of the invention loops in the resulting routes, such as when the same component is found multiple times in a route, are removed. In according to various aspects and embodiments of the invention, the tool is able to create more than just the network interface units, for instance create an initial legal topology through some simple heuristic or topology synthesis.

Referring now to FIG. 4, the user identifies a source or node for which the user modifies or issues commands to modify the NoC topology from this initial NoC topology. For example, the user selects all routes initiating from the same source. The user then determines or selects the routes to modify. The user selects the set of routes through the NoC, onto which the change needs to be done. In this non-limiting example, routes from source 302 are selected. The selected source 302 (and its set of routes) can have one or more routes according to various aspects and embodiments of the invention. If source has more than one route, all selected routes shall have one or more elements (in this example source) in common.

Referring now to FIG. 5, source 302 is identified and an element selected—in this example a switch—and an insertion point is identified according to various aspects and embodiments of the invention. In this example, there are four routes from source 302. Also, an insertion point for a new element, such as a switch, is identified. From the insertion point of switch 502, the user selects all routes going from source 302 to a destination that receives traffic from source 302, as shown by the routes. The tool guides the user to use an insertion point for inserting switch 502. All routes from source 302 are now routed from switch 502. As shown, the tool automatically modifies the four connections or routes going from source 302 to its four destinations 310, 312, 314, and 316 into a single connection between source 302 and switch 502. Then from switch 502 to the four destinations 310, 312, 314, and 316 of traffic. According to various aspects and embodiments of the invention, these routes have not been modified directly by the user. According to various aspects and embodiments of the invention, the tools inferred the routes considering the required connectivity and the changes to the routes performed by the user.

Figure 6:
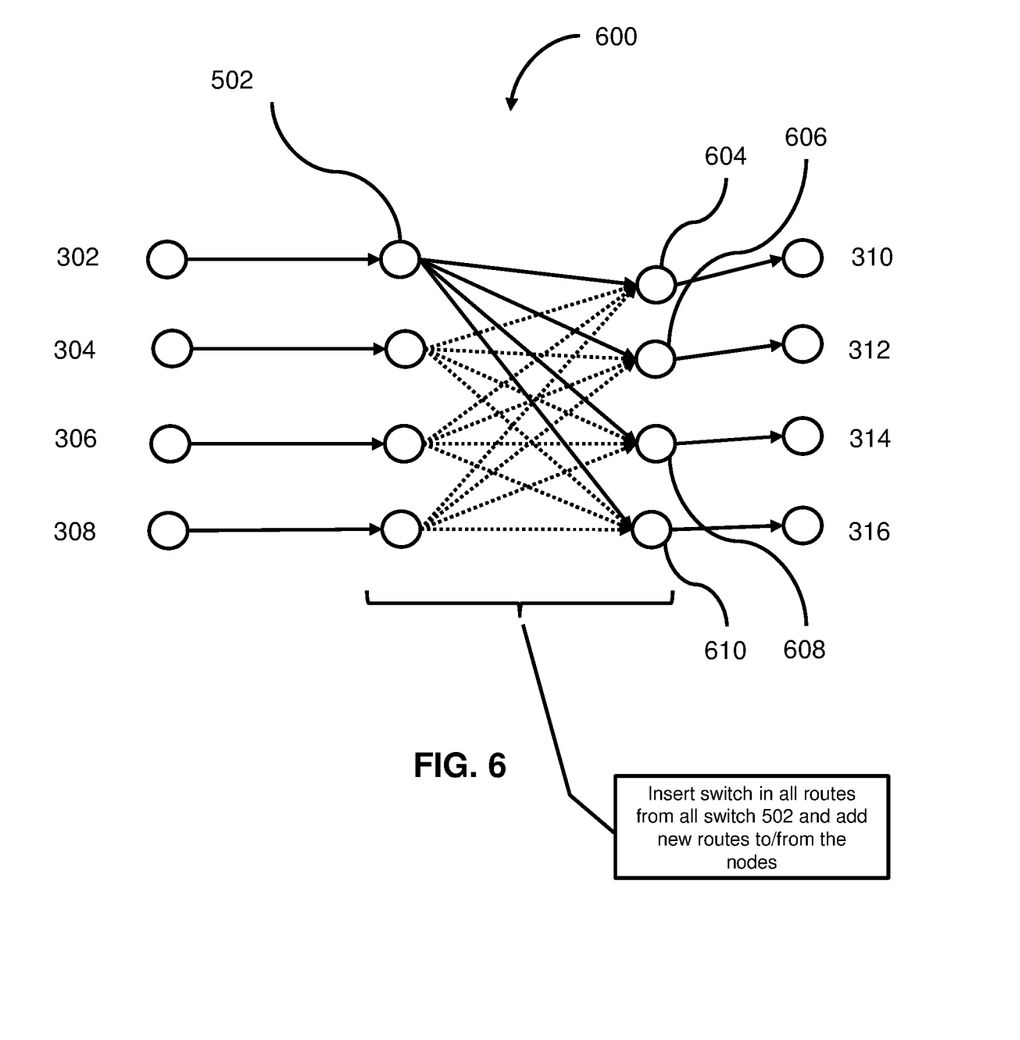
FIG. 6. illustrates modification of FIG. 5 in accordance with the various aspects and embodiments of the invention.

Referring now to FIG. 6, a replace operation is shown according to various aspects and embodiments of the invention. Insertion points are identified for each source 304, 306, and 308, similar to the process for switch 502 of FIG. 5. The tool is capable of identifying and generating an insertion point for each route emerging from each source 304, 306, and 308 in order to generate a single route emerging from each source 304, 306, and 308 and connecting to a new NoC element, such as a switch, similar to the process disclose in FIG. 5 with respect to locating the insertion point and inserting switch 502.

From the insertion point of switch 502, the user selects all routes going from source 302 and switch 502 to any destination 310, 312, 314, and 316. The tool guides the user to use an insertion point for inserting switches between switch 502 and destination sources 310, 312, 314, and 316. All routes from source 302 are now routed through switch 502 and switches 604, 606, 608, and 610. Thus, the routes emerging from switch 502 are considered and insertion points identified as needed. Thus, according to various aspects and embodiments of the invention, routes to (and from) switch 502 are selected along with an insertion point for those routes. The resulting example, shown for source 302, is the routes from source 302 to switch 502, to switch 604, and the destination 310. Additionally, the resulting example, shown for source 302, is the route from source 302 to switch 502, to switch 606, and the destination 312. Additionally, the resulting example, shown for source 302, is the route from source 302 to switch 502, to switch 606, and the destination 312. Additionally, the resulting example, shown for source 302, is the route from source 302 to switch 502, to switch 608, and the destination 314. Additionally, the resulting example, shown for source 302, is the route from source 302 to switch 502, to switch 608, and the destination 316.

Figure 7:
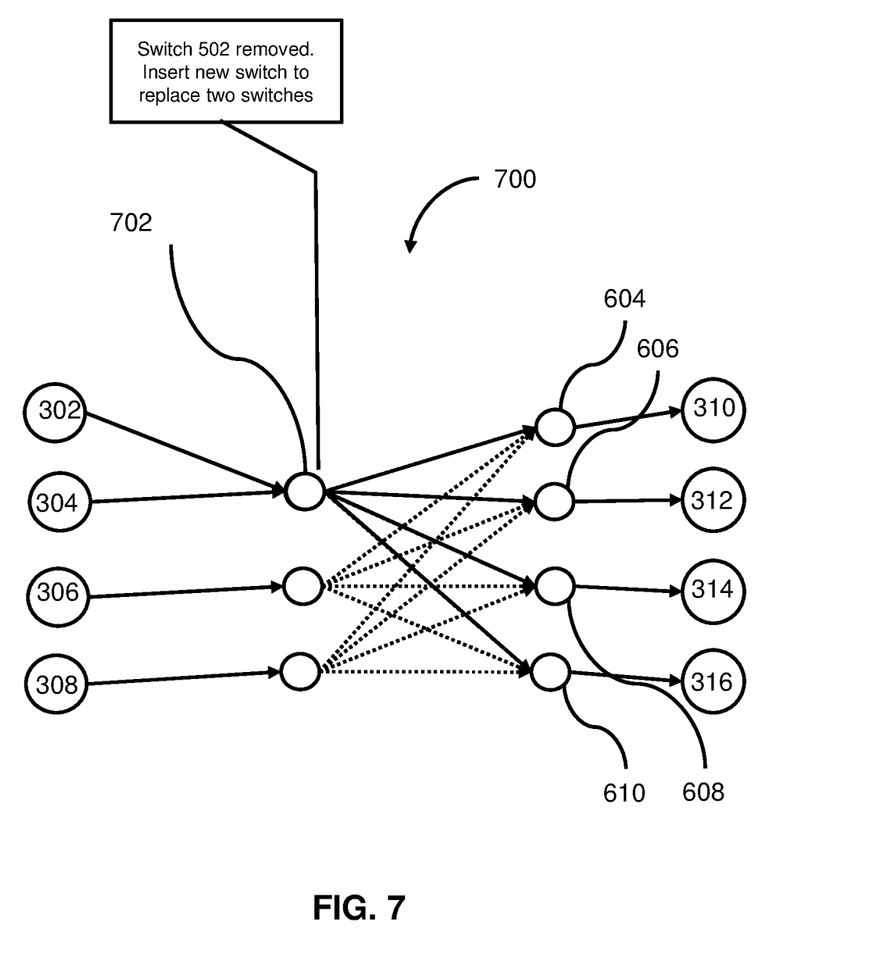
FIG. 7 illustrates modification of FIG. 6 in accordance with the various aspects and embodiments of the invention.

Referring now to FIG. 7, a chart 700 is shown wherein the user replaces switch 502 at the insertion point by a new NoC element, for example switch 702. In this non-limiting example, the insertion point is now the location to where source 302 and source 304 send traffic. According to various aspects and embodiments of the invention, the tool automatically removes the no longer required element, such as switch 502 because no routes go through it anymore. The tool also handles all the connections to switch 502 by removing and replacing with one connection or route between source 302 and switch 702. Additionally, all routes between switch 502 and switches 604, 606, 608, and 610 are dropped or removed. There is also a route from source 304 o switch 702. Thus, there are now routes from switch 702 to each of switches 604, 606, 608, and 610. According to various aspects and embodiments of the invention, the routes for all other switches are handled in a similar manner. According to various aspects and embodiments of the invention, the tool provides information to and queries the user before removing the no longer required element and inserting new element.

Figure 8:
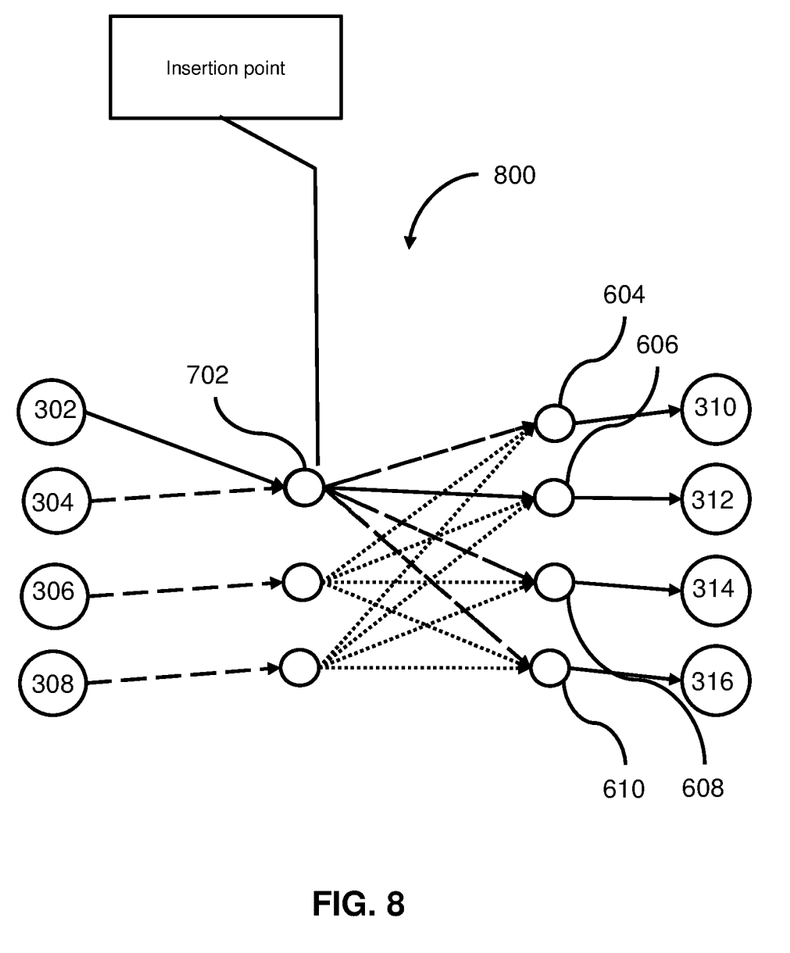
FIG. 8 illustrates modification of FIG. 7 in accordance with the various aspects and embodiments of the invention.

Referring now to FIG. 8, according to various aspects and embodiments of the invention, a chart 800 shown where the user selects a single traffic route for further modification, for example the route between source 302 and destination 312. The other traffic routes originating from source 302 are also shown and are not discussed in this specific example. The tool analyzes the traffic flow from source 302, to switch 702, to switch 606, to destination 312. The insertion points for this route include switch 702 and switch 606. The tool determines if there are a rule violations and provides the information, if any, to the user through a graphical user interface or similar device. According to various aspects and embodiments of the invention, the user may keep this representation and the tool can produce the netlist. According to various aspects and embodiments of the invention, the user may further reduce the insertion point by deleting the insertion point 702.

Figure 9:
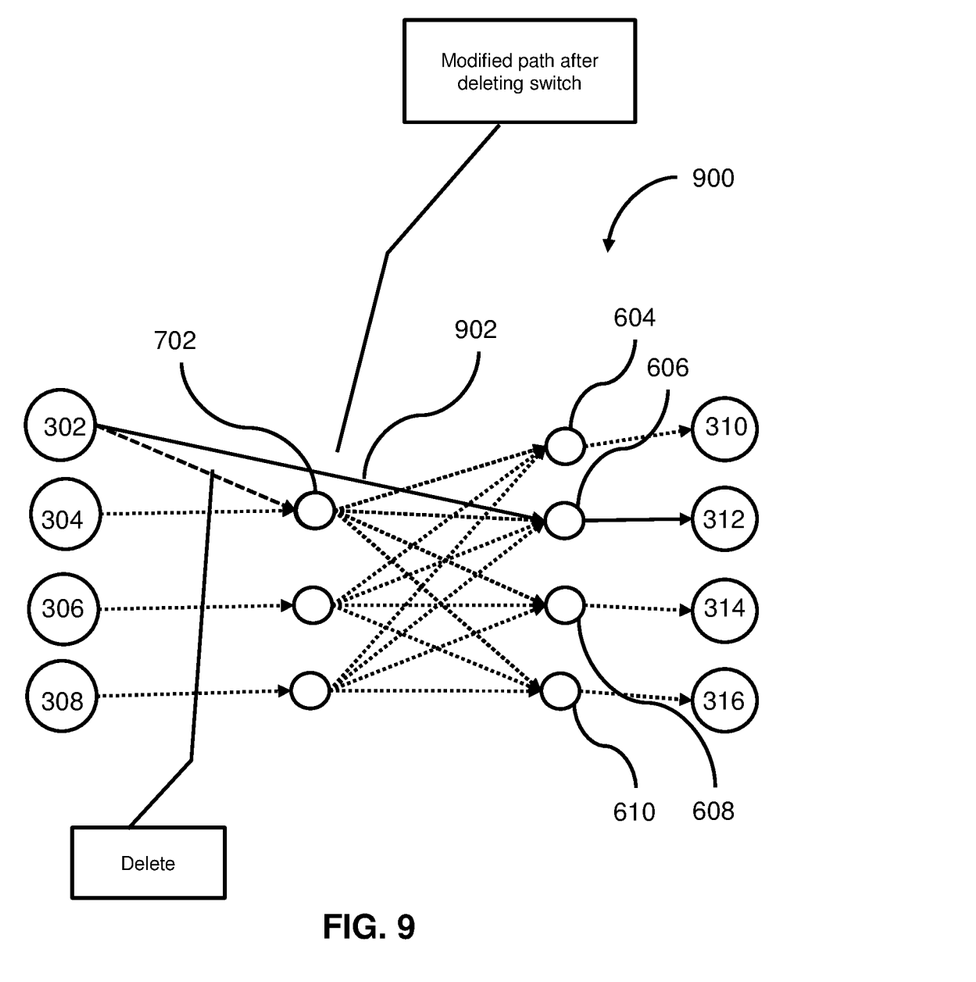
FIG. 9 illustrates modification of FIG. 8 by the user deleting an insertion point causing an illegal route that needs correcting in accordance with the various aspects and embodiments of the invention.

Referring now to FIG. 9, a chart 900 is shown wherein the user deletes the insertion point at switch 702 for the path from source 302 because the insertion point (for source 302) was combined with the insertion point that already exists this location (for source 304 that has an insertion point), for the selected route discussed in FIG. 8. The tool now generates or identifies a route 902 and adds route 902 (new insertion point for source 302), which is at switch 606. The route 902 connects source 302 to switch 606. Source 302 now has two routes: 302 and 902. Additionally, if the insertion point (for source 302) was removed from the selected route, switch 702 is not deleted because there are other routes going through it. The resulting NoC topology is illegal for this non-limiting example because it only supports one connection out of a source of traffic. The rule violation can be indicated to the user on a display with a color coding. Although there is a rule violation or the route is illegal, it is perfectly normal that in the process of editing its topology the user ends up in transient illegal states, which the user will be prompted to fix. According to various aspects and embodiments of the invention, the user may add a switch to all routes from source 302 and routes after. According to various aspects and embodiments of the invention, the user inserts (or allows the tool to insert) the route 902 using a new insertion point for the source 302 at the switch 606.

According to various aspects and embodiments of the invention, the tool is adapted for handling only sub-sections of the network on-chip. According to various aspects and embodiments of the invention, the tool is adapted to modify more than one NoC, wherein the NoC are interconnected and within a single chip or across multiple connected chips.

Certain methods according to the various aspects of the invention may be performed by instructions that are stored upon a non-transitory computer readable medium or memory and executed by a processor. The non-transitory computer readable medium stores code including instructions that, if executed by one or more processors, would cause a system or computer to perform steps of the method described herein. The non-transitory computer readable medium includes: a rotating magnetic disk, a rotating optical disk, a flash random access memory (RAM) chip, and other mechanically moving or solid-state storage media. Any type of computer-readable medium is appropriate for storing code comprising instructions according to various example.

Certain examples have been described herein and it will be noted that different combinations of different components from different examples may be possible. Salient features are presented to better explain examples; however, it is clear that certain features may be added, modified, and/or omitted without modifying the functional aspects of these examples as described.

Some examples are one or more non-transitory computer readable media arranged to store such instructions for methods described herein. Whatever machine holds non-transitory computer readable media comprising any of the necessary code may implement an example. Some examples may be implemented as: physical devices such as semiconductor chips; hardware description language representations of the logical or functional behavior of such devices; and one or more non-transitory computer readable media arranged to store such hardware description language representations. Descriptions herein reciting principles, aspects, and embodiments encompass both structural and functional equivalents thereof. Elements described herein as coupled have an effectual relationship realizable by a direct connection or indirectly with one or more other intervening elements.

Practitioners skilled in the art will recognize many modifications and variations. The modifications and variations include any relevant combination of the disclosed features. Descriptions herein reciting principles, aspects, and embodiments encompass both structural and functional equivalents thereof. Elements described herein as "coupled" or "communicatively coupled" have an effectual relationship realizable by a direct connection or indirect connection, which uses one or more other intervening elements. Embodiments described herein as "communicating" or "in communication with" another device, module, or elements include any form of communication or link and include an effectual relationship. For example, a communication link may be established using a wired connection, wireless protocols, near-filed protocols, or RFID.

To the extent that the terms "including", "includes", "having", "has", "with", or variants thereof are used in either the detailed description and the claims, such terms are intended to be inclusive in a similar manner to the term "comprising."

The scope of the invention, therefore, is not intended to be limited to the exemplary embodiments and aspects that are shown and described herein. Rather, the scope and spirit of the invention is embodied by the appended claims.

What is claimed is:

1. A method comprising:
    receiving a description of a network-on-chip (NoC) connectivity, including:
        receiving a list of sources of traffic; and
        receiving a list of destinations of traffic;
    creating an initial NoC topology chart showing routes for traffic between each source and each of the source's respective destinations;
    receiving user input for changes to at least one route;
    determining an insertion point for a NoC element;
    inserting the NoC element at the insertion point;
    updating the initial NoC topology to generate a new NoC topology that includes the NoC element at the insertion point;
    analyzing the new NoC topology for rule violations; and
    reporting the rule violation to a user.

2. The method of claim 1, wherein the description used to create an initial NoC topology includes a plurality of network interface units needed by each source and destination of traffic.

3. The method of claim 2, wherein the NoC topology includes required direct connections as part of the routes.

4. The method of claim 1, further comprising generating a netlist for the new NoC topology.

5. The method of claim 1, wherein the user input includes electing one or more routes to modify.

6. The method of claim 1, wherein the user input includes selecting a plurality of routes for editing such that all of the selected plurality of routes for editing have at least one element in common.

7. The method of claim 1 further comprising:
    receiving, as input from the user, a route to modify;
    identifying at least one common element in a route to modify;
    selecting the insertion point along the route.

8. The method of claim 1, further comprising performing an editing operation on a set of selected routes and the insertion point, wherein the editing operation includes at least one of:
    inserting a new element after the insertion point;
    inserting a new element before the insertion point;
    replacing the insertion point by another NoC element; and
    deleting the insertion point.

9. The method of claim 1 further comprising automatically inferring, from a set of routes selected for editing, the changes required to the initial NoC topology including at least one of:
    removing elements no longer on any routes;
    adding new elements; and
    rewiring interconnections between elements to implement the required physical connectivity between NoC elements.

10. The method of claim 9 further comprising generating a netlist.

11. A system comprising:
  memory for storing code;
  a display; and
  a processor in communication with the memory and the display, wherein the processor executes the code to cause the system to:
    receive connectivity information for a network-on-chip (NoC) including sources and destinations;
    create an initial NoC topology chart for traffic between each source and each of the source's respective destinations;
    receive at least one user input identifying at least one change to the initial NoC topology;
    determine an insertion point for a NoC element based on the at least one change;
    inserts the NoC element at the insertion point;
    generate a new NoC topology by updating the initial NoC topology having the NoC element at the insertion point;
    analyzing the new NoC topology for rule violations; and
    reporting the rule violation to a user.

12. The system of claim 11, wherein the processor executes the code to further cause the system to generate a netlist for the new NoC topology.

* * * * *